(12) United States Patent
Su et al.

(10) Patent No.: US 7,816,744 B2
(45) Date of Patent: Oct. 19, 2010

(54) GATE ELECTRODES OF HVMOS DEVICES HAVING NON-UNIFORM DOPING CONCENTRATIONS

(75) Inventors: Ru-Yi Su, Kouhu Township (TW); Puo-Yu Chiang, Su-ao Township (TW); Jeng Gong, Hsin-Chu (TW); Tsung-Yi Huang, Hsin-Chu (TW); Chun-Lin Tsai, Hsin-Chu (TW); Chien-Chih Chou, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 83 days.

(21) Appl. No.: 12/170,133

(22) Filed: Jul. 9, 2008

(65) Prior Publication Data

US 2010/0006934 A1 Jan. 14, 2010

(51) Int. Cl.
*H01L 29/49* (2006.01)
(52) U.S. Cl. ............................. 257/409; 257/E29.152
(58) Field of Classification Search .......... 257/E29.152, 257/367, 409; 438/237
See application file for complete search history.

(56) References Cited

U.S. PATENT DOCUMENTS

2006/0001050 A1* 1/2006 Wang et al. ................. 257/213

* cited by examiner

*Primary Examiner*—W. David Coleman
*Assistant Examiner*—Daniel Shook
(74) *Attorney, Agent, or Firm*—Slater & Matsil, L.L.P.

(57) ABSTRACT

A semiconductor structure includes a semiconductor substrate; a first high-voltage well (HVW) region of a first conductivity type overlying the semiconductor substrate; a second well region of a second conductivity type opposite the first conductivity type overlying the semiconductor substrate and laterally adjoining the first well region; a gate dielectric extending from over the first well region to over the second well region; a drain region in the second well region; a source region on an opposite side of the gate dielectric than the drain region; and a gate electrode on the gate dielectric. The gate electrode includes a first portion directly over the second well region, and a second portion directly over the first well region. The first portion has a first impurity concentration lower than a second impurity concentration of the second portion.

18 Claims, 9 Drawing Sheets

GATE ELECTRODES OF HVMOS DEVICES HAVING NON-UNIFORM DOPING CONCENTRATIONS

TECHNICAL FIELD

This invention relates generally to semiconductor devices, and more particularly to metal-oxide-semiconductor (MOS) devices, and even more particularly to the structure and manufacturing methods of high-voltage MOS devices.

BACKGROUND

High-voltage metal-oxide-semiconductor (HVMOS) devices are widely used in many electrical devices, such as input/output (I/O) circuits, CPU power supplies, power management systems, AC/DC converters, etc. There are a variety of forms of HVMOS devices. A symmetric HVMOS device may have a symmetric structure on the source side and drain side. High voltages can be applied on both drain and source sides. An asymmetric HVMOS device may have asymmetric structures on the source side and drain side. For example, only one of the source side and drain side, typically the drain side, is designed for sustaining high voltages.

FIG. 1 illustrates a conventional asymmetric HVPMOS device 2, which includes gate oxide 10, gate electrode 12 on gate oxide 10, drain region 4 in a high-voltage p-well (HVPW) region, and source region 6 in a high-voltage n-well (HVNW) region. Shallow trench isolation (STI) region 8 spaces drain region 4 apart from gate electrode 12, so that a high drain-to-gate voltage can be applied. The HVNW region and HVPW region are formed on an n-type buried layer (NBL).

The conventional HVPMOS device 2 suffers from drawbacks. FIG. 2 illustrates an I-V curve obtained from HVPMOS device 2, wherein the X-axis represents reversed drain-to-source voltages (−Vds), and the Y-axis represents leakage currents (−Ids). It is noted that when operated in a high (reversed) drain-source voltage regions. For example, when high reversed drain-to-source voltages Vds (about −60 volts or greater) are applied, soft breakdown (refer to region 16), which is an undesirable behavior, occurs. Further, the leakage current of HVPMOS device 2 needs to be further reduced. Therefore, a solution for the above-discussed problems is needed.

SUMMARY OF THE INVENTION

In accordance with one aspect of the present invention, a semiconductor structure includes a semiconductor substrate; a first high-voltage well (HVW) region of a first conductivity type overlying the semiconductor substrate; a second well region of a second conductivity type opposite the first conductivity type overlying the semiconductor substrate and laterally adjoining the first well region; a gate dielectric extending from over the first well region to over the second well region; a drain region in the second well region; a source region on an opposite side of the gate dielectric than the drain region; and a gate electrode on the gate dielectric. The gate electrode includes a first portion directly over the second well region, and a second portion directly over the first well region. The first portion has a first impurity concentration lower than a second impurity concentration of the second portion.

In accordance with another aspect of the present invention, a semiconductor structure includes a semiconductor substrate; a high-voltage n-well (HVNW) region overlying the semiconductor substrate; a high-voltage p-well (HVPW) region overlying the semiconductor substrate, wherein the HVNW and the HVPW regions laterally contact each other and form a first interface; an insulation region extending from a top surface of the HVPW region into the HVPW region, wherein an inner edge of the insulation region is spaced apart from the first interface; a gate dielectric extending from over the HVNW region to over the insulation region; a drain region in the HVPW region, wherein the drain region is heavily doped with a p-type impurity; and a gate electrode on the gate dielectric and including a first portion and a second portion at a same vertical level, wherein the first portion has a first p-type impurity concentration, and the second portion has a second p-type impurity concentration higher than the first impurity concentration.

In accordance with yet another aspect of the present invention, a semiconductor structure includes a semiconductor substrate; a HVNW region overlying the semiconductor substrate; a HVPW region overlying the semiconductor substrate, wherein the HVNW and the HVPW regions laterally contact each other and form a first interface; an insulation region extending from a top surface of the HVPW region into the HVPW region, wherein an inner edge of the insulation region is spaced apart from the first interface; a gate dielectric extending from over the HVNW region to over the insulation region; a source region in the HVNW region; a drain region in the HVPW region; and a gate electrode on the gate dielectric. The gate electrode includes a first edge portion adjoining a first gate spacer, wherein the first edge portion is directly over the insulation region; and a second edge portion adjoining a second gate spacer and at a same vertical level as the first edge portion. The second edge portion is directly over the HVNW region. The first edge portion of the gate electrode has a first net p-type impurity concentration lower than a second net p-type impurity concentration of the second edge portion.

In accordance with yet another aspect of the present invention, a method of forming a semiconductor structure includes providing a semiconductor substrate; forming a first HVW region of a first conductivity type overlying the semiconductor substrate; forming a second HVW region of a second conductivity type opposite the first conductivity type overlying the semiconductor substrate and laterally adjoining the first HVW region; forming a gate dielectric extending from over the first HVW region to over the second HVW region; forming a drain region in the second HVW region; forming a source region on an opposite side of the gate dielectric than the drain region; and forming a gate electrode on the gate dielectric. The gate electrode includes a first portion directly over the second HVW region, and a second portion directly over the first HVW region. The first portion has a first impurity concentration lower than a second impurity concentration of the second portion.

In accordance with yet another aspect of the present invention, a method of forming a semiconductor structure includes providing a semiconductor substrate; forming a HVNW region overlying the semiconductor substrate; forming a HVPW region overlying the semiconductor substrate, wherein the HVNW and the HVPW regions laterally contact each other and form a first interface; forming an insulation region extending from a top surface of the HVPW region into the HVPW region, wherein an inner edge of the insulation region is spaced apart from the first interface; forming a gate dielectric extending from over the HVNW region to over the insulation region; forming a gate electrode over the gate dielectric; forming a first mask covering a first portion of the gate electrode directly overlying the HVPW region, wherein a second portion of the gate electrode directly overlying the HVNW region is not covered by the first mask; and performing a first implantation to form a source region and a drain region, wherein the source region is in the HVNW region, and the drain region is in the HVPW region, and wherein the second portion of the gate electrode is implanted during the first implantation, and the first portion of the gate electrode is not implanted during the first implantation.

The advantageous features of the present invention include reduced source-drain on-state resistances and reduced leakage currents of HVMOS devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A high-voltage metal-oxide-semiconductor (HVMOS) embodiment is described with reference to FIGS. 3 through 10, and variations of the preferred embodiments are then discussed. Throughout the various views and illustrative embodiments of the present invention, like reference numbers are used to designate like elements.

Figure 1:
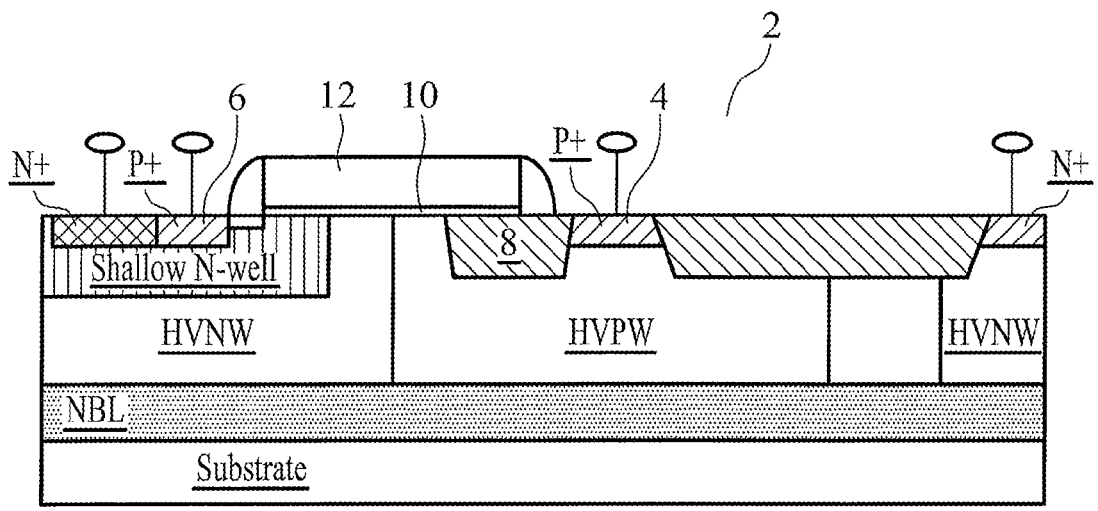
FIG. 1 illustrates a cross-sectional view of a conventional high-voltage p-type MOS (HVPMOS) device.
Figure 2:
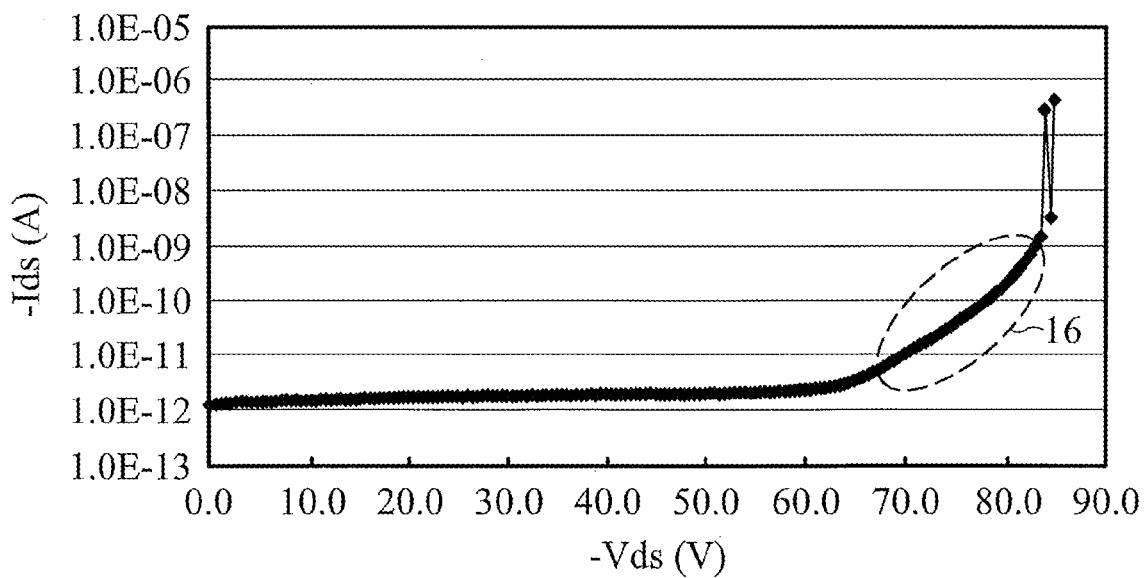
FIG. 2 illustrates an I-V curve measured at reverse bias of the HVPMOS device shown in FIG. 1.
Figure 3:
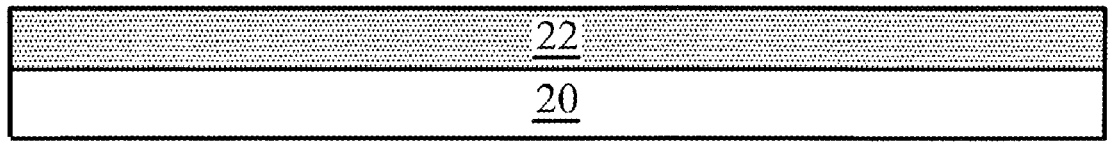
FIGS. 3 through 10 are cross-sectional views of intermediate stages in the manufacturing of a HVPMOS device.

Referring to FIG. 3, substrate 20 is provided. Substrate 20 is preferably formed of a semiconductor material such as silicon, silicon germanium, or the like. Preferably, substrate 20 is lightly doped with a p-type impurity, although it can also be doped with an n-type impurity.

An implantation is performed to substrate 20, forming n-type buried layer (NBL) 22. In an exemplary embodiment, phosphorous, antimony, and/or arsenic may be implanted. Alternatively, NBL 22 may be formed by diffusing an n-type impurity into substrate 20 at an elevated temperature.

Figure 4:
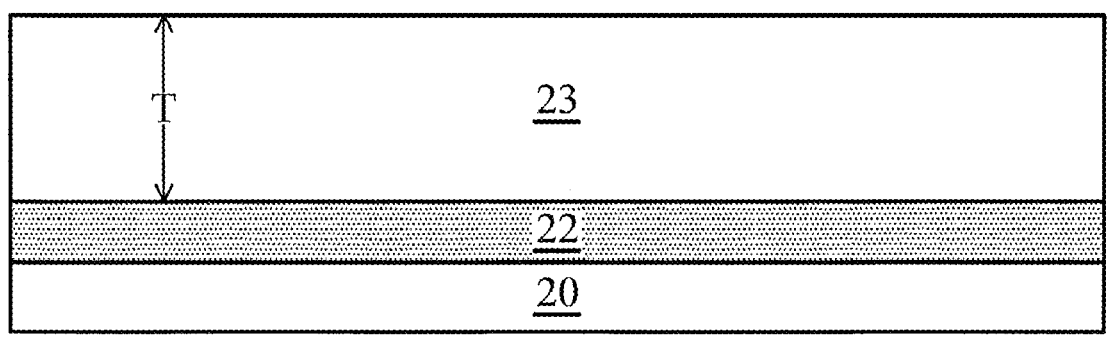

FIG. 4 illustrates the epitaxial growth of epitaxial layer 23 on NBL 22. Epitaxial layer 23 is preferably formed of a semiconductor material such as silicon, and can be the same as, or different from, the material of substrate 20. Epitaxial layer 23 may either be un-doped, or lightly doped with a p-type or an n-type impurity, which is preferably in-situ doped while the epitaxial growth proceeds. In an exemplary embodiment, epitaxial layer 23 is doped with an n-type impurity, such as phosphorous, antimony and/or arsenic, with the concentration equal to the desirable concentration of the subsequently formed high-voltage p-well region (HVPW) 28 (refer to FIG. 5). In other embodiments, epitaxial layer 23 is doped with a p-type impurity. The concentration may be between about $10^{14}/cm^3$ and about $10^{17}/cm^3$. The thickness T of epitaxial layer 23 is preferably equal to the desirable thickness of the subsequently formed high-voltage p-type and n-type well regions. In an exemplary embodiment, thickness T is greater than about 2 nm.

Figure 5:
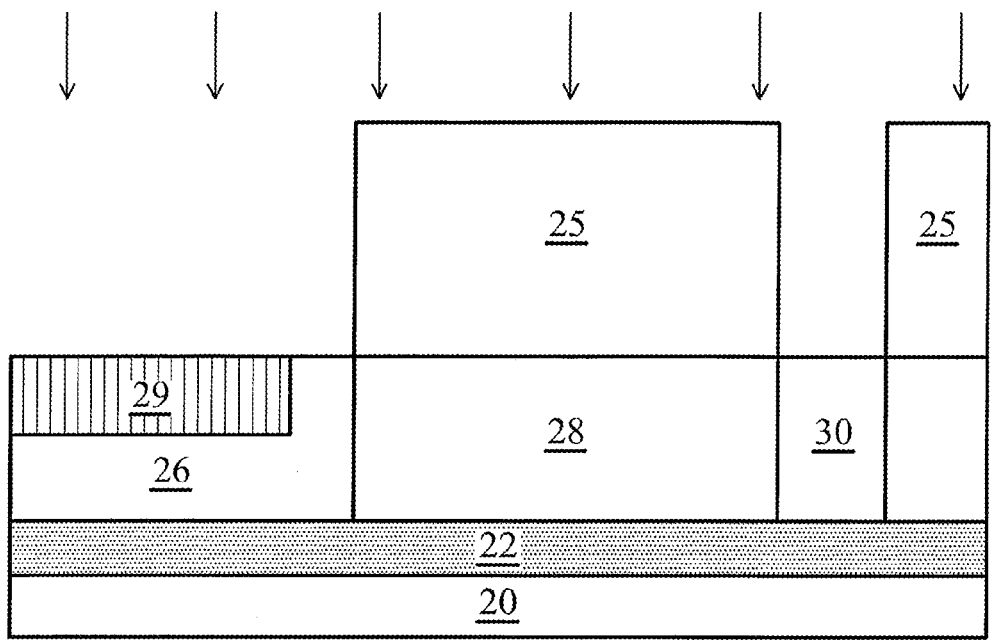

FIG. 5 illustrates the formation of high-voltage n-well (HVNW) regions 26 and 30 and HVPW region 28 in epitaxial layer 23. Photoresist 25 is formed to cover regions where HVPW regions are to be formed, while the future HVNW regions are exposed. An implantation is then performed to introduce an n-type impurity, such as arsenic, phosphorous, and the like, into epitaxial layer 23, forming HVNW regions 26 and 30. The p-type impurity in the doped epitaxial layer 23 (if in-situ doped with p-type impurities) is neutralized by the implanted n-type impurity, with the net concentration in implanted regions 26 and 30 being of n-type. In an exemplary embodiment, the net n-type impurity concentration in HVNW regions 26 and 30 is between about $10^{14}/cm^3$ to about $10^{17}/cm^3$, although the impurity concentration may be higher or lower. Please note that although HVNW regions 26 and 30 may be two separate regions, they can also be portions of a continuous HVNW ring encircling HVPW region 28, if shown in a top view.

Regions masked by photoresist 25 become HVPW regions, including HVPW region 28. After the formation of regions 26, 28, and 30, photoresist 25 is removed. In alternative embodiments, an additional photoresist (not shown) is formed, by which regions 26 and 30 are covered, while HVPW region 28 is exposed. An additional implantation is then performed to introduce a p-type impurity, such as boron, indium, and the like, forming HVPW region 28.

In other embodiments, epitaxial layer 23 (refer to FIG. 4) is not doped, and HVNW regions 26 and 30 and HVPW region 28 are all formed by implantations, wherein the depths of these regions are controlled by appropriate implantation energies.

Optionally, shallow n-well 29 is formed by an implantation with the help of an additional photoresist (not shown). Shallow n-well 29 may have an impurity concentration higher than the impurity concentration of HVPW 26. In an exemplary embodiment, shallow n-well 29 is formed simultaneously with the formation of an n-well for a PMOS device in a core/logic circuit region (not shown).

Figure 6:
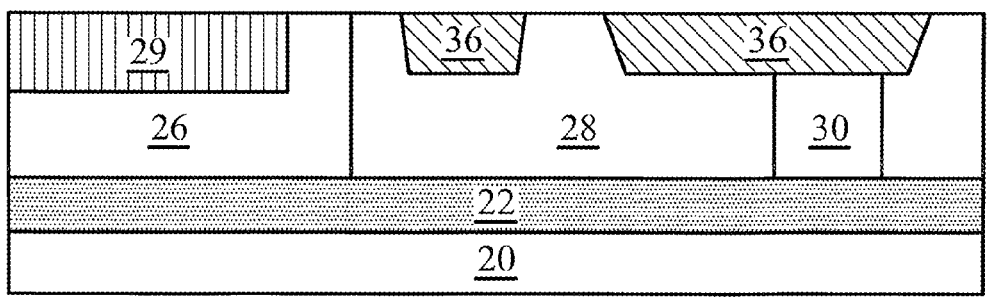

FIG. 6 illustrates the formation of insulation regions 36. In the preferred embodiment, as is shown in FIG. 6, insulation regions 36 are formed by forming trenches in HVPW region 28 and HVNW regions 26 and 30, filling the trenches with a dielectric material, such as $SiO_2$ or high-density plasma (HDP) oxide, and performing a chemical mechanical polish to level the surface of the filled dielectric material. The resulting shallow trench isolation (STI) regions are insulation regions 36. In other embodiments, the insulation regions are field oxides. An exemplary formation process includes forming a mask layer, preferably comprising SiN, over HVNW regions 26 and 30 and HVPW region 28. The mask layer is then patterned to form openings. A local oxidation is then performed, and insulation regions (field oxides) 36 are formed in the openings. The mask layer is then removed.

In the above-discussed embodiments, insulation regions 36 are shown as being formed after the formation of well regions 26, 28, and 30. One skilled in the art will realize that different orders can be used. For example, in alternative embodiments, after the formation of epitaxial layer 23, insulation regions 36 are formed, followed by the formation of well regions 26, 28, and 30.

Figure 7:
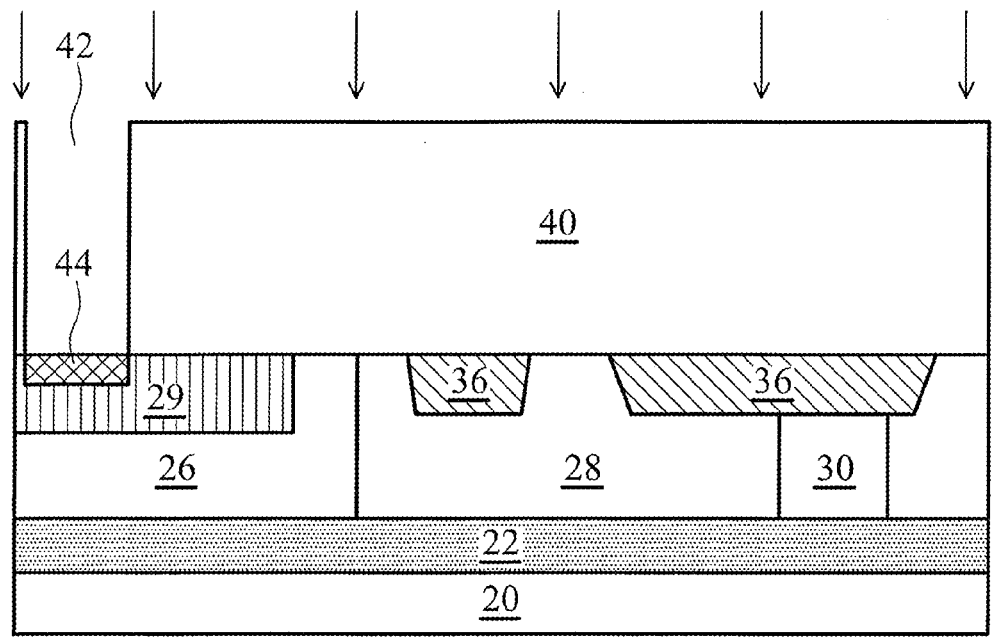

Referring to FIG. 7, photoresist 40 is applied and patterned, forming openings 42. An n-type dopant implantation is performed, forming N+region 44 in HVNW region 26 (or shallow n-well 29). Preferably, N+ region 44 comprise arsenic, phosphorous and/or other n-type dopants, and is heavily doped to a concentration of greater than about $10^{20}/cm^3$. N+ region 44 acts as the contact region (also referred to as pickup regions) of HVPW region 26. Photoresist 40 is then removed.

Figure 8:
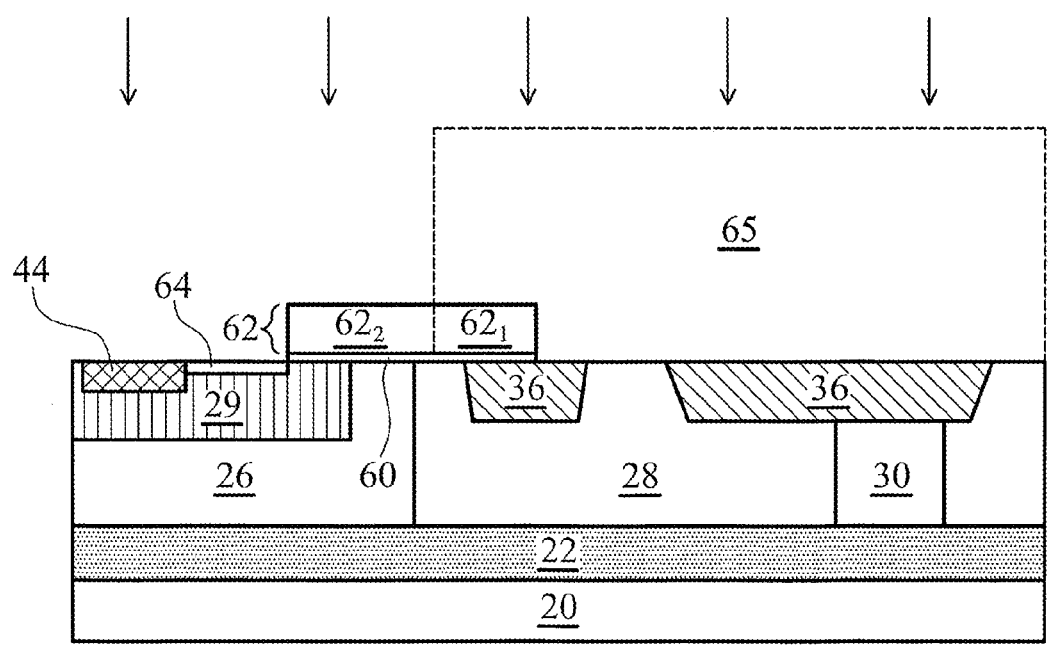

FIG. 8 illustrates the formation of gate dielectric 60, gate electrode 62, and lightly-doped source region 64. As is known in the art, gate dielectric 60 may include silicon oxide, although other dielectric materials such as silicon nitride, silicon carbide, silicon oxynitride, high-k materials, combinations thereof, and multi-layers thereof, can be used. Gate electrode 62 may include polysilicon. As is known in the art, the formation of gate dielectric 60 and gate electrode 62 may include blanket deposition a gate dielectric layer and a polysilicon layer (not shown), and patterning the gate dielectric layer and the polysilicon layer. In an embodiment, the gate electrode layer is un-doped. In alternative embodiments, the gate electrode layer is in-situ doped lightly. Preferably, gate dielectric 60 and gate electrode 62 extend from over HVNW region 26 to over HVPW region 28, and a side edge of gate electrode 62 may be directly over the insulation region 36 in HVPW region 28.

FIG. 8 also illustrates the formation of lightly-doped source region 64 in shallow n-well region 29. In a first embodiment, gate electrode 62 is used as a mask, and hence an entirety of gate electrode 62 is doped at the time lightly-doped source region 64 is formed. In a second embodiment, mask 65 (for example, a photoresist) is formed to cover portion $62_1$ of gate electrode 62, which is close to the drain side of the resulting HVMOS device, while portion $62_2$ of gate electrode 62, which is close to the source side, is not covered. Accordingly, the portion $62_1$ is not doped during the formation of lightly-doped source region 64, while the portion $62_2$ is doped. The desirable position of the interface between portions $62_1$ and $62_2$ is discussed in detail in subsequent paragraphs. Preferably, the dosage for forming lightly-doped source region 64 is between about $1 \times 10^{12}/cm^2$ and about $5 \times 10^{13}/cm^2$.

Figure 9:
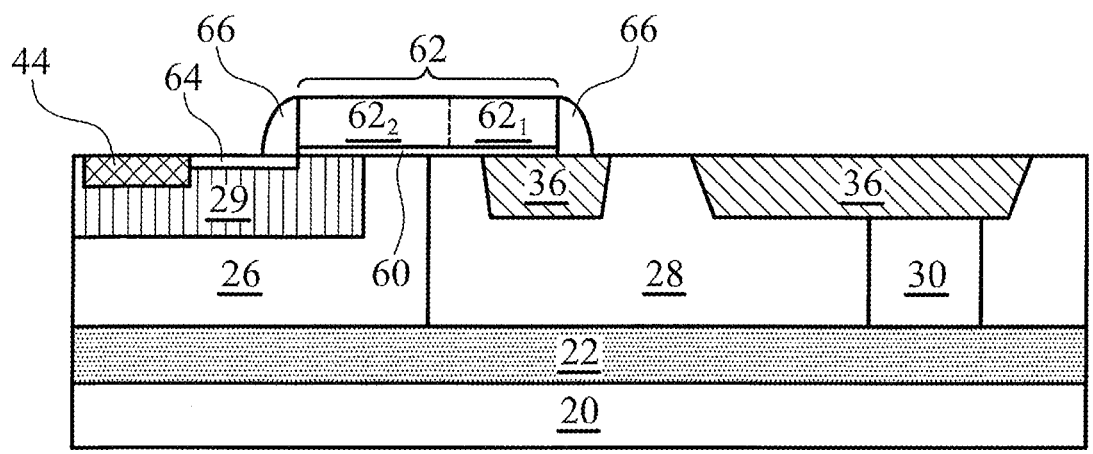

Referring to FIG. 9, after the formation of lightly-doped source region 64, gate spacers 66 are formed, for example, by blanket forming a dielectric material, and removing undesirable portions from horizontal surfaces.

Figure 10:
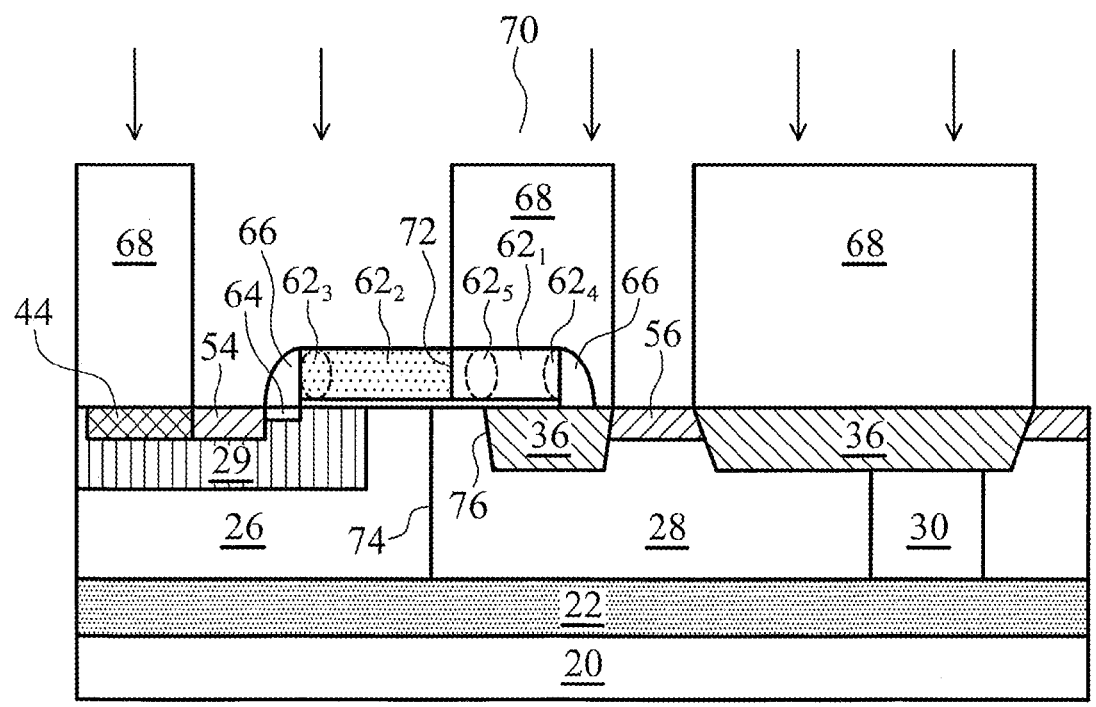

Referring to FIG. 10, photoresist 68 is formed and patterned. A p-type impurity implantation is performed, forming P+ region 54 in HVNW region 26 and P+ region 56 in HVPW region 28. Next, source/drain silicide regions and gate silicide (not shown) may be formed on source/drain regions. HVPMOS device 70 is thus formed. The P+ dopant may include boron and/or indium. Preferably, the p-type dopant is heavily doped to a concentration of greater than about $10^{20}/cm^3$. In the described embodiments, heavily doped means an impurity concentration of above about $10^{20}/cm^3$, depending upon the specific device type, technology generation, minimum feature size, and the like. P+ region 54 acts as the source region of the resulting HVPMOS device 70, while P+ region 56 acts as the drain region. After the implantation, photoresist 68 is removed. Since gate electrode 62 is spaced apart from N+ region 56, a high gate-drain voltage can be applied.

During the formation of source region 54 and drain region 56, photoresist 68 covers the portion $62_1$ of gate electrode 62, while the portion $62_2$ of gate electrode 62 is exposed to the source/drain implantation. Accordingly, the portion $62_1$ is not doped during the formation of source/drain regions 54 and 56, while the portion $62_2$ is doped.

The portion $62_1$ and the portion $62_2$ have an interface 72. Preferably, interface 72 is substantially horizontally between interface 74 and the inner edge 76 of insulation region 36, wherein interface 74 is the interface of HVPW region 28 and HVNW region 26. It is desirable that interface 72 is not over HVNW region 26, so that the formation of portion $62_1$ does not affect the threshold voltage of HVPMOS device 70. On the other hand, portion $62_1$ preferably includes a portion $62_5$ directly over edge 76 of insulation region 36.

It is realized that the subsequent thermal budgets, such as the annealing for forming the source/drain silicide regions, the activation of source/drain regions 54/56, and end-of-the-line processes, may cause the p-type impurities in the portion $62_2$ to diffuse into the portion $62_1$. However, in the resulting structure, the net p-type impurity concentration in the portion $62_2$ will still be higher than the net p-type impurity concentration in the portion $62_1$. In an exemplary embodiment, the p-type impurity concentration in edge portion $62_3$ of gate electrode 62 is 7 orders, or even 9 orders, higher than that of edge portion $62_4$. In an alternative embodiment, due to the diffusion of the p-type impurity from the portion $62_2$ into the portion $62_1$, portion $62_5$, which is directly over the inner edge 76 of STI region 36, has a p-type impurity concentration lower than that of edge portion $62_3$, but higher than that of edge portion $62_4$. Please note that due to process reasons, gate electrode 62 may, or may not, receive n-type impurities. Accordingly, the above-discussed p-type impurity concentrations in gate electrode 62 may represent the impurity concentrations of p-type impurities only, or more preferably represent the impurity concentrations of net impurity concentrations with n-type impurity concentrations deducted.

In alternative embodiments, shallow n-well 29, gate dielectric 60, gate electrode 62, and gate spacers 64 are formed after the formation of STI region 36, but before the formation of P+ pickup region 44 and P+ regions 54 and 56. P+ regions 54 and 56 may also be formed before the formation of gate dielectric 60, gate electrode 62 and gate spacers 64. One skilled in the art will realize the respective process steps.

Figure 11:
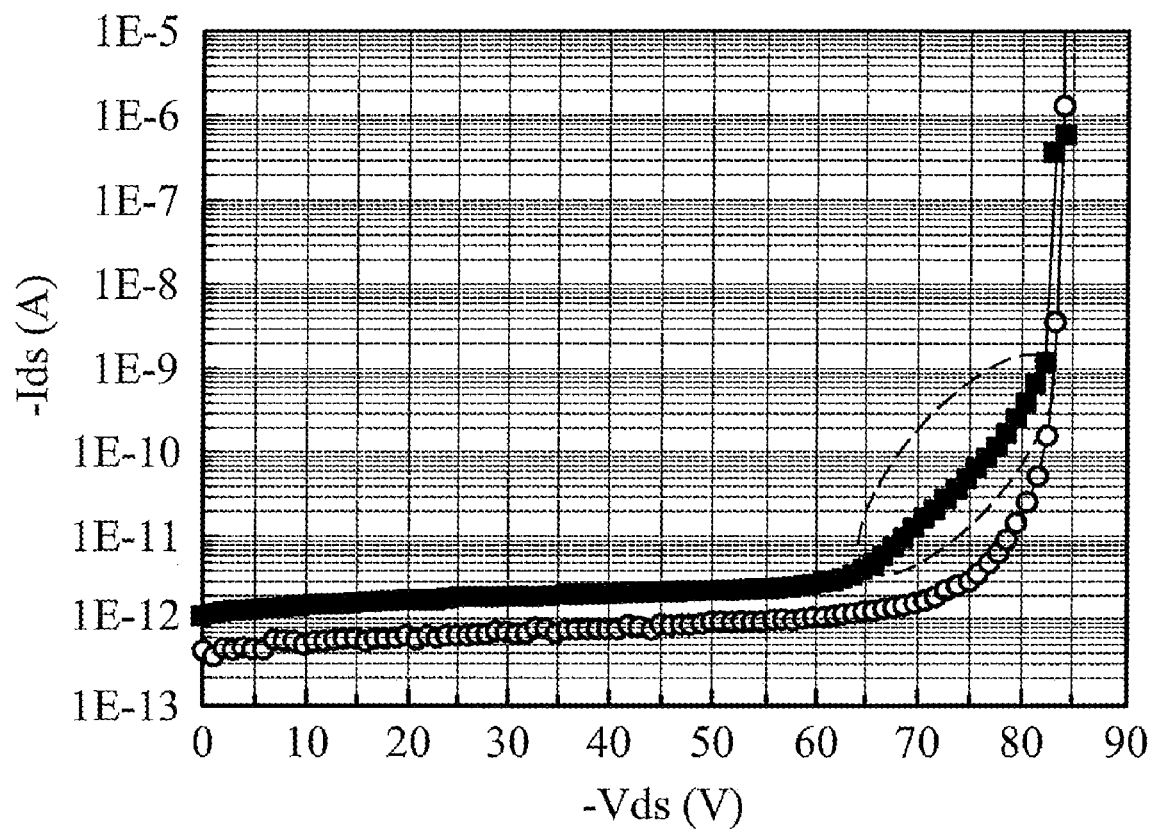
FIG. 11 illustrates I-V curves of HVPMOS devices, with the results obtained from conventional structures compared to embodiments of the present invention.

FIG. 11 illustrates I-V characteristics measured from HVPMOS devices, wherein the X-axis represents the reversed drain-to-source voltages (−Vds) applied between source region 54 and drain region 56, and the Y-axis represents leakage currents (−Ids). Solid squares are obtained from a first sample whose gate electrode is uniformly doped, while hollow circles are obtained from a second sample having the structure as shown in FIG. 10. It is noted that the second sample has significantly lower leakage currents than the first sample. Also, the second sample does not have noticeable soft breakdown, as compared to the noticeable soft breakdown of the first sample (note the regions marked by a dotted ellipse).

Figure 12:
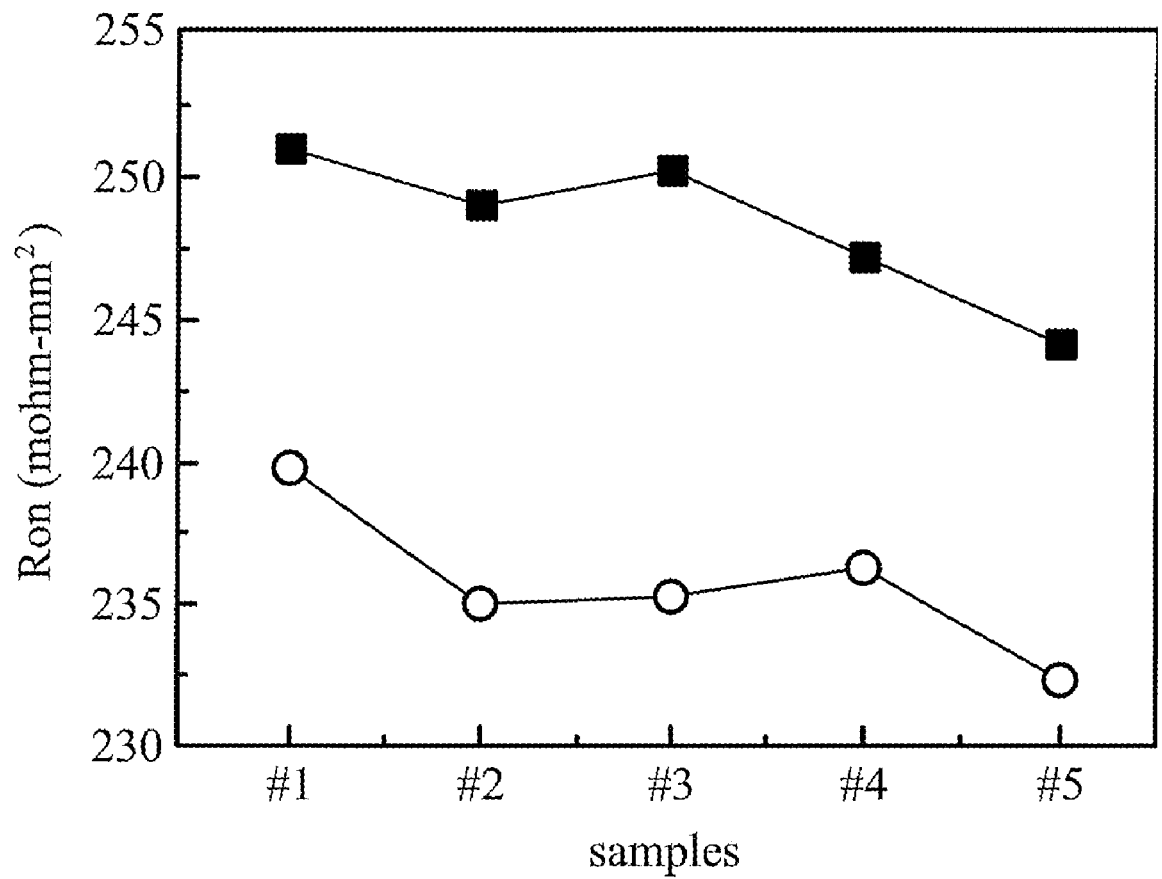
FIG. 12 illustrates on-resistances of plurality of samples HVMOS devices.

FIG. 12 illustrates the on-resistances between source regions and drain regions of sample HVPMOS devices. Solid squares are obtained from a first group of samples whose gate electrodes are uniformly doped, while hollow circles are obtained from a second group of samples having the structure shown in FIG. 10. It is noted that the second group of samples have significantly lower on-resistances than the first group of samples.

Figure 13:
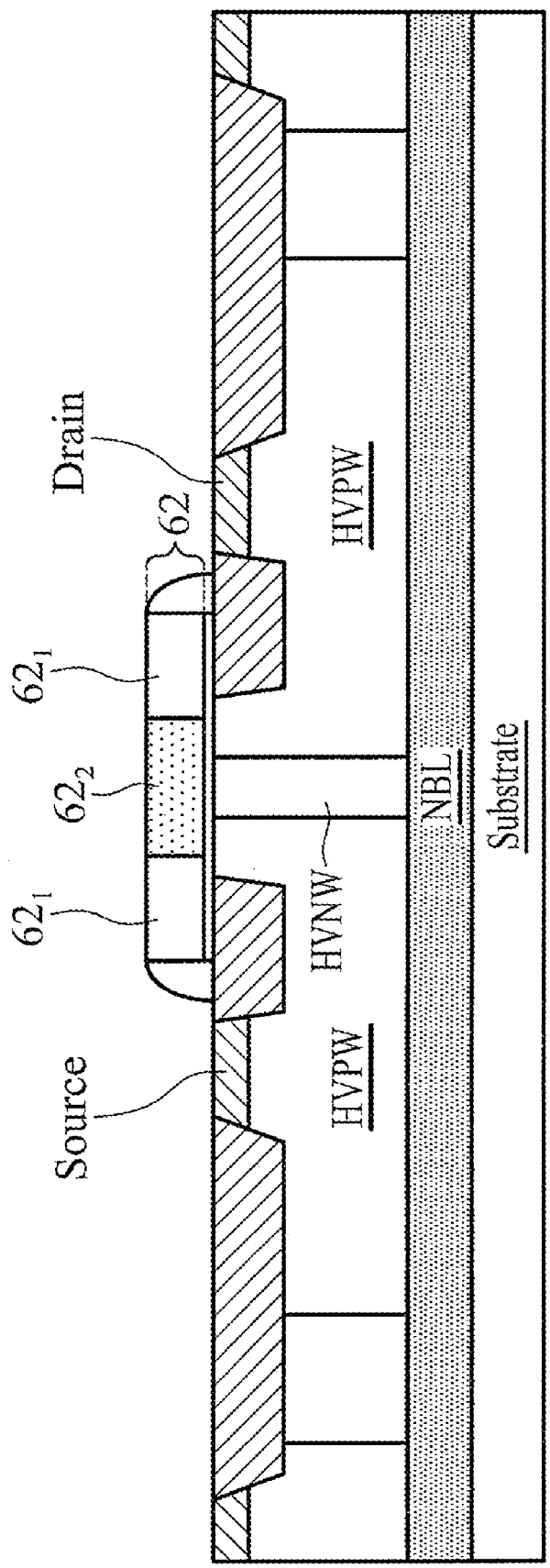
FIG. 13 illustrates a symmetric HVPMOS device embodiment.

The previously illustrated embodiments have asymmetric structures, wherein the source and drain regions are in high-voltage well regions having different conductivity types. FIG. 13 illustrates a HVPMOS embodiment having a symmetric structure, wherein the HVPMOS device includes two HVPW regions and a HVNW region therebetween. Similarly, the gate electrode 62 of the symmetric HVPMOS device as shown in FIG. 13 has portion 62$_2$ in the middle, and portions 62$_1$ on opposite sides of the portion 62$_2$. Portions 62$_1$ at least have a lower p-type impurity concentration than portions 62$_2$, and may be substantially un-doped.

Figure 14:
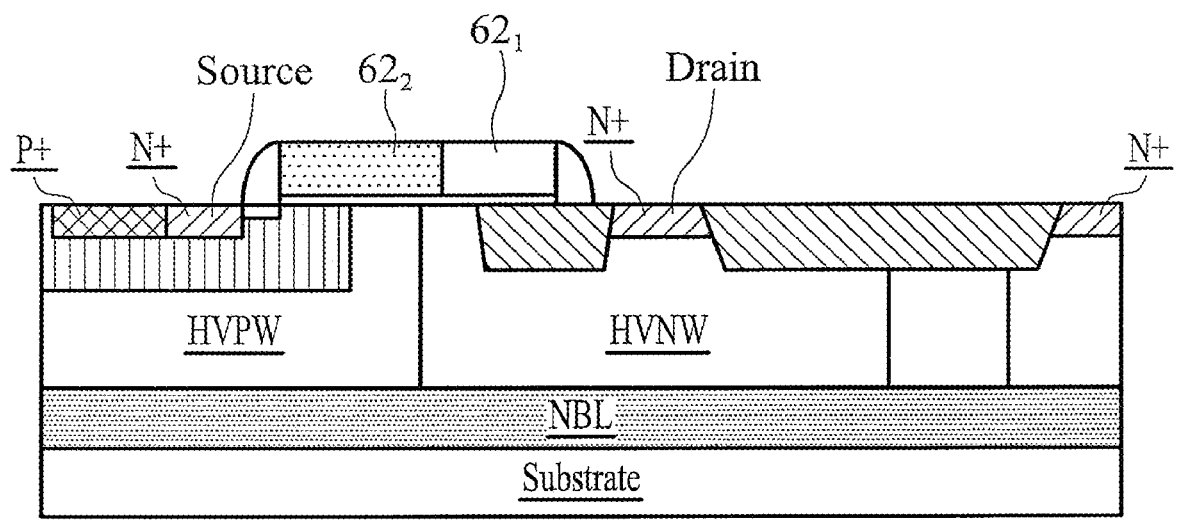
FIG. 14 illustrates a HVNMOS device embodiment of the present invention.

Although the preferred embodiments of the present invention illustrate the formation of a HVPMOS device, one skilled in the art will realize the respective formation steps for forming HVNMOS devices, with the conductivity types of regions 26, 28, 29 and 30, 44, 54 and 56, and gate electrode, etc., reversed (refer to FIG. 10). An exemplary illustrative embodiment is shown in FIG. 14. It should also be appreciated that HVMOS devices may have various different layouts. However, the concept of the present invention may still be applied. Similarly, a symmetric HVNMOS may be formed with a similar structure as shown in FIG. 13, except the conductivity types of the doped regions are inversed.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
a semiconductor substrate;
a first well region of a first conductivity type overlying the semiconductor substrate;
a second well region of a second conductivity type opposite the first conductivity type overlying the semiconductor substrate and laterally adjoining the first well region;
a gate dielectric over the first well region and the second well region;
a gate electrode on the gate dielectric, wherein the gate electrode comprises a first portion over the second well region, a second portion over the first well region, and wherein the first portion has a first impurity concentration lower than a second impurity concentration of the second portion; and
an insulation region in a recess of the second well region, wherein the gate electrode has an edge directly over the insulation region and an inner edge of the recess is directly under the gate electrode, wherein the first and the second portions of the gate electrode have a first interface horizontally between the inner edge of the recess and a second interface, wherein the second interface is an interface of the first and the second well regions.

2. A semiconductor structure comprising:
a semiconductor substrate;
a high-voltage n-well (HVNW) region overlying the semiconductor substrate;
a high-voltage p-well (HVPW) region overlying the semiconductor substrate, wherein the HVNW and the HVPW regions laterally contact each other and form a first interface;
an insulation region extending from a top surface of the HVPW region into the HVPW region, wherein an inner edge of the insulation region is spaced apart from the first interface;
a gate dielectric extending from over the HVNW region to over the insulation region;
a drain region in the HVPW region, wherein the drain region is heavily doped with a p-type impurity; and
a gate electrode on the gate dielectric and comprising a first portion and a second portion at a same vertical level, wherein the first portion has a first p-type impurity concentration, and the second portion has a second p-type impurity concentration higher than the first p-type impurity concentration, the first portion and the second portion having a second interface, the second interface being positioned between the first interface and the inner edge.

3. A semiconductor structure comprising:
a semiconductor substrate;
a high-voltage n-well (HVNW) region overlying the semiconductor substrate;
a high-voltage p-well (HVPW) region overlying the semiconductor substrate, wherein the HVNW and the HVPW regions laterally contact each other and form a first interface;
an insulation region extending from a top surface of the HVPW region into the HVPW region, wherein an inner edge of the insulation region is spaced apart from the first interface;
a gate dielectric extending from over the HVNW region to over the insulation region;
a source region in the HVNW region;
a drain region in the HVPW region; and
a gate electrode on the gate dielectric, wherein the gate electrode comprises:
a first edge portion adjoining a first gate spacer, wherein the first edge portion is directly over the insulation region; and
a second edge portion adjoining a second gate spacer and at a same vertical level as the first edge portion, wherein the second edge portion is directly over the HVNW region, and wherein the first edge portion of the gate electrode has a first net p-type impurity concentration lower than a second net p-type impurity concentration of the second edge portion, wherein the second net-p-type impurity concentration of the gate electrode extends horizontally through the gate electrode from the second edge portion to a point directly over a region defined by the first interface and the inner edge of the insulation region.

4. The semiconductor structure of claim 1, wherein a portion of the gate electrode directly overlying the recess has a third impurity concentration lower than the first impurity concentration, and lower than the second impurity concentration.

5. The semiconductor structure of claim 1, wherein a source region is in the first well region.

6. The semiconductor structure of claim 1, wherein the first and the second portions are at a same vertical level.

7. The semiconductor structure of claim 1, wherein the first conductivity type is n-type, and the second conductivity type is p-type.

8. The semiconductor structure of claim 1, wherein the first conductivity type is p-type, and the second conductivity type is n-type.

9. The semiconductor structure of claim 1 further comprising a buried doped layer overlying the semiconductor substrate and underlying the first and the second well regions.

10. The semiconductor structure of claim 1 further comprising:
a third well region of the second conductivity on an opposite side of the first well region than the second well region, wherein the gate electrode further comprises a third portion directly over the third well region, and wherein the second impurity concentration is greater than a third impurity concentration in the third portion.

11. The semiconductor structure of claim 2, wherein the first portion is closer to the drain region than the second portion.

12. The semiconductor structure of claim 2, wherein a third portion of the gate electrode directly over the inner edge of the insulation region has a third p-type impurity concentration lower than a fourth p-type impurity concentration of an edge portion of the gate electrode, wherein the edge portion is directly over the HVNW region.

13. The semiconductor structure of claim 2, wherein the gate electrode comprises:
a first edge portion adjoining a first gate spacer, wherein the first edge portion is directly over the insulation region; and
a second edge portion adjoining a second gate spacer, wherein the second edge portion is directly over the HVNW region, and wherein the first edge portion of the gate electrode has a fifth p-type impurity concentration lower than a sixth p-type impurity concentration of the second edge portion.

14. The semiconductor structure of claim 2 further comprising:
an additional HVPW region adjoining the HVNW region and on an opposite side of the HVNW region than the HVPW region, wherein the gate electrode further comprises a third portion directly over the additional HVPW region and at a same level as the first and the second portions, and wherein a seventh p-type impurity concentration of the third portion is substantially equal to the first p-type impurity concentration.

15. The semiconductor structure of claim 13, wherein the fifth p-type impurity concentration is lower than the sixth p-type impurity concentration by greater than 7 orders.

16. The semiconductor structure of claim 14, wherein a third interface between the first and the third portion of the gate electrode is directly over the additional HVPW region.

17. The semiconductor structure of claim 3, wherein the first net p-type impurity concentration is lower than the second net p-type impurity concentration by greater than about 7 orders.

18. The semiconductor structure of claim 3, wherein a portion of the gate electrode directly overlying the inner edge of the insulation region has a third net p-type impurity concentration higher than the first net p-type impurity concentration and lower than the second net p-type impurity concentration.

* * * * *